United States Patent [19]

Chaki

[11] Patent Number: 4,586,391
[45] Date of Patent: May 6, 1986

[54] CROSS ARM MECHANISM IN PUSHBUTTON TUNER

[75] Inventor: Takao Chaki, Tokyo, Japan

[73] Assignee: Clarion Co., Ltd., Tokyo, Japan

[21] Appl. No.: 561,248

[22] Filed: Dec. 13, 1983

[30] Foreign Application Priority Data

Dec. 14, 1982 [JP] Japan ............................ 57-188020
Dec. 14, 1982 [JP] Japan ............................ 57-188021
Dec. 14, 1982 [JP] Japan ............................ 57-188024

[51] Int. Cl.⁴ ........................................ F16H 35/18
[52] U.S. Cl. ........................ 74/10.37; 74/10.35; 334/7
[58] Field of Search ............... 74/10.31, 10.33, 10.35, 74/10.37, 10.39; 334/7

[56] References Cited

U.S. PATENT DOCUMENTS

| | | | |
|---|---|---|---|
| 3,602,051 | 8/1971 | Olah | 74/10.35 |
| 3,943,779 | 3/1976 | Ganderton | 74/10.35 |
| 4,106,351 | 8/1978 | Santoro | 74/10.37 |
| 4,133,214 | 1/1979 | Cicala | 74/10.37 |
| 4,143,555 | 3/1979 | Ohashi | 74/10.37 |
| 4,187,729 | 2/1980 | Kanai | 74/10.37 |
| 4,194,403 | 3/1980 | Satoro | 74/10.37 |
| 4,232,560 | 11/1980 | Dellantonio | 74/10.37 |
| 4,248,102 | 2/1981 | Shimazu | 74/10.33 |
| 4,254,389 | 3/1981 | Nishikawa | 334/7 |

Primary Examiner—Carl Stuart Miller
Attorney, Agent, or Firm—Flynn, Thiel, Boutell & Tanis

[57] ABSTRACT

The cross arm mechanism for a pushbutton tuner includes an arm plate rotatably supporting a frequency setting plate, a plate spring mounted on the arm plate for locking the frequency setting plate from its circumference, and first and second pins uniting the arm plate and the plate spring together. The mechanism is particularly characterized in employment the first and second pins which are different in height.

2 Claims, 8 Drawing Figures

CROSS ARM MECHANISM IN PUSHBUTTON TUNER

FIELD OF THE INVENTION

This invention is directed to a pushbutton tuner, and more particularly to an improvement of a cross arm mechanism thereof capable of reducing the production cost.

BACKGROUND OF THE INVENTION

Car radios in general are designed to be tuned manually and automatically. A cross arm mechanism is provided particularly for automatic tuning operation, more specifically to predetermine a positional relation between a frequency setting plate and a memory slide plate corresponding to a frequency selected by a manually-operated tuning knob.

The cross arm mechanism includes an arm plate, a frequency setting plate rotatably supported on the arm plate for rotation in response to a movement of a memory slide plate and a plate spring supported on the arm plate for forcibly capturing and locking the frequency setting plate. The arm plate and the plate spring are united together by a pair of pins to prevent relative rotation thereof.

In the prior art mechanism, however, the pins are fixed by caulking and are the same in height. This invites a problem in the assembling process and an increase of the production cost.

OBJECT OF THE INVENTION

It is therefore an object of the invention to improve the composition of the cross arm mechanism in a pushbutton tuner so as to reduce the production cost, facilitate the assembling work and ensure accurate cooperative relations between the constituents.

SUMMARY OF THE INVENTION

In accordance with the present invention, there is provided a cross arm mechanism in a pushbutton tuner wherein first and second pins uniting an arm plate and a plate spring are different in height or wherein the both pins are made by partly cutting the arm plate itself and raising the cut portions vertically of the main surface of the arm plate.

DETAILED DESCRIPTION OF THE PREFERRED EMBODIMENTS

The invention will now be described in detail by way of preferred embodiments illustrated in the accompanying drawings.

Figure 1:
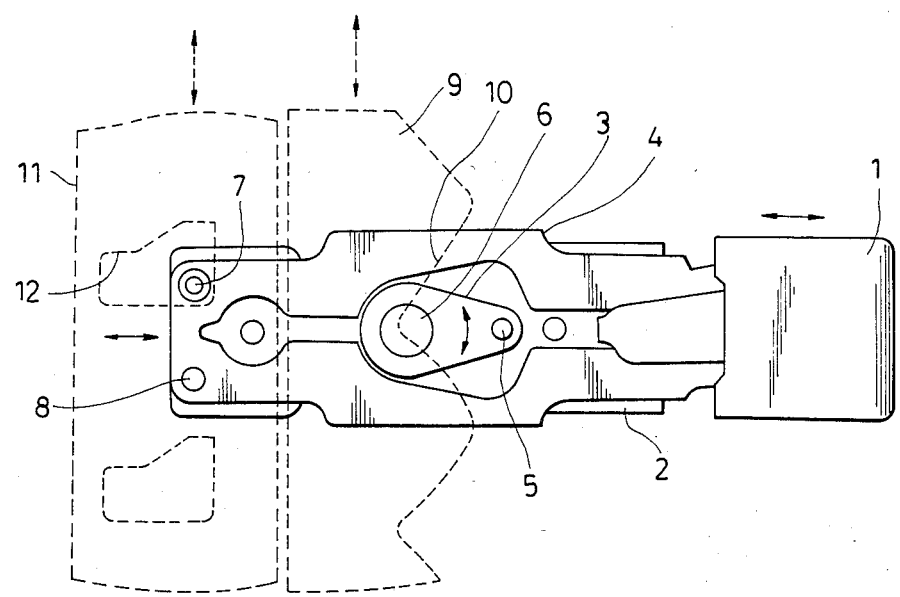
FIGS. 1 and 2 are a plan view and a side elevation of a cross arm mechanism embodying the invention.
Figure 2:
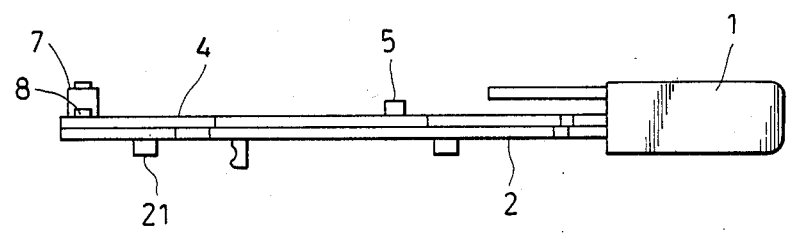

FIGS. 1 and 2 are a plan view and a side elevation of a cross arm mechanism for use in a pushbutton tuner embodying the invention. Reference numeral 1 designates a pushbutton, 2 is an arm plate having one end inserted into the pushbutton 1 and rotatably supporting frequency setting plate 3 thereon. Reference numeral 4 denotes a plate spring laid over the arm plate 2 and having one end inserted into the pushbutton 1. The plate spring 4 is adapted to lockingly capture the frequency setting plate 3 from the circumference thereof. The frequency setting plate 3 is configured in a cam shape and has at one end portion thereof a frequency setting pin 5. The frequency setting plate 3 is rotatably supported on the arm plate 2 by an axle 6.

Reference numerals 7 and 8 refer to first and second pins uniting together the arm plate 2 and the plate spring 4. The both pins 7 and 8 are different in height, namely, the first pin 7 is lower than the second pin 8. Only one of the pins (the first pin 7, for example) is fixed by caulking whilst the other pin (second pin 8, for example) is fixed by pressure fitting.

Prior to using the automatic tuning function, a desired frequency must be preset. To this end, when the memory slide plate 9 is set at a position corresponding to the desired frequency by turning a tuning knob, the pushbutton 1 is pushed in so as to shift the frequency setting plate 3 under the memory slide plate 9. Along with the movement, the frequency setting plate 3 rotates because the frequency setting pin 5 is guided by a sloping edge 10 of the memory slide plate 9. When the frequency setting plate is fully pushed to a position wherein the frequency setting pin 5 enters the notch defined by the sloping edges 10, the frequency setting plate 3 is firmly captured and locked unrotatably by the plate spring 4. Thus, preset of the desired frequency is completed.

Thereafter, the preset frequency is always selected merely by pushing the pushbutton 1 because the frequency setting pin 5 of the frequency setting plate 3 now unrotatably locked by the plate spring 4 pushes the sloping edge 10 and moves the slide plate 9 to the position corresponding to the frequency.

It will be understood by the skilled in the art that plural pushbuttons 1 and associated members therewith may be provided in correspondence with the number of broadcasting stations to individually preset the corresponding frequencies.

A changeover lever 11 for changing bands (AM, FM, etc.) overlaps with the tip of the plate spring. The changeover lever 11 has guide holes 12 each receiving therein the first pin 7 which moves the changeover lever 11 in the arrow direction in FIG. 1 in response to advancement of the arm plate 2 to effect the band changeover operation. If the second pin 8 is as high as the first pin 7 as in the prior art mechanism, the changeover lever 11 must also be formed with further holes each for permitting free movement of the second pin 8. According to the invention, however, since one of the pins (second pin 8) is so low it can slip under the changeover lever 11, holes in the changeover lever may be reduced to the number of the first pins 7, which leads to a simpler structure. Further, since only one of the pins needs caulking fixture, the mechanism can be more readily assembled. This leads to a cost reduction.

Figure 3:
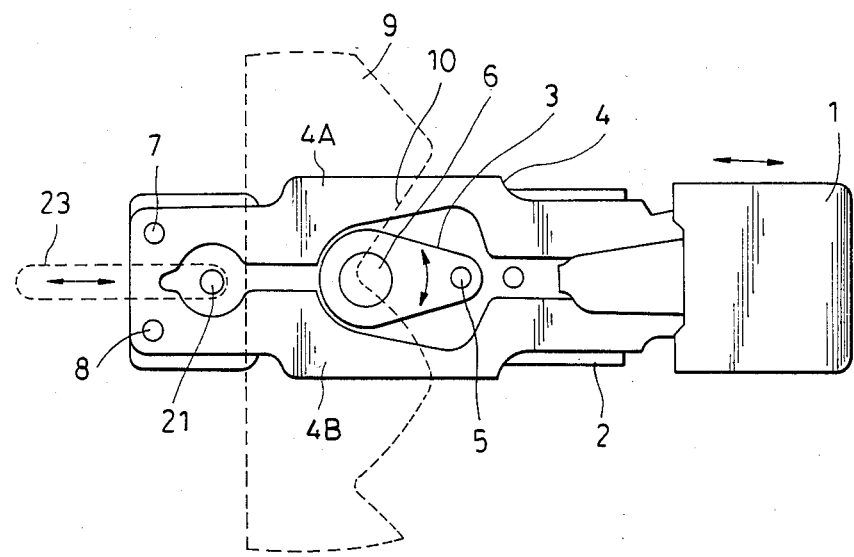
FIGS. 3, 4a and 4b are a plan view and cross sectional views illustrating further embodiments of the invention.
Figure 4:
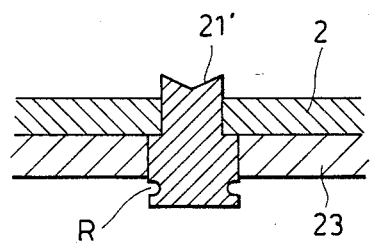
Figure 4:
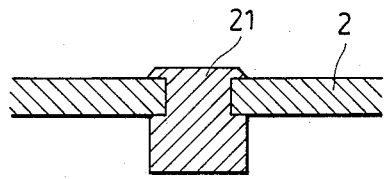

As shown in FIG. 3, a guide pin 21 is fixed to the arm plate 2 and projects downward from the bottom face of the plate 2 for engagement with an elongated hole 23 formed in a radio frame to regulate reciprocal movement of the arm plate 2. In the prior art mechanism, however, it is difficult to keep a smooth movement of the arm plate 2 because the lower tip of the guide pin 21 is deformed and expanded like a flange as the result of caulking fixture thereof to the arm plate 2. In this connection, the guide pin 21 employed in the present invention has a circular groove R near the tip thereof as shown in FIG. 4a so that when the guide pin 21 inserted into the arm plate 2 and supported by a support member 23 is applied with a pressure for caulking fixture to the arm plate 2, the deformation at the lower end is absorbed by the circular groove R so that the lower end never expands radially. Therefore, the guide pin 21 is kept always constant in diameter and ensures a smooth reciprocation of the arm plate 2 and an accurate frequency selection. This allows employment of a header to effect the caulking fixture, and therefore leads to a cost reduction.

Figure 5:
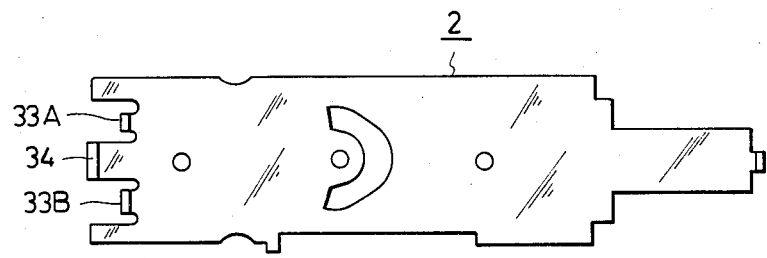
FIGS. 5a and 5b are a plan view and a side elevation illustrating a frequency setting member.
Figure 5:
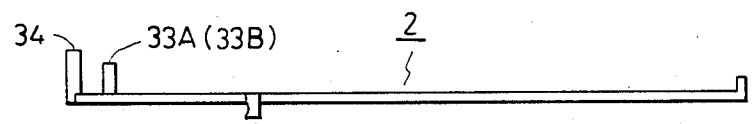
Figure 6:
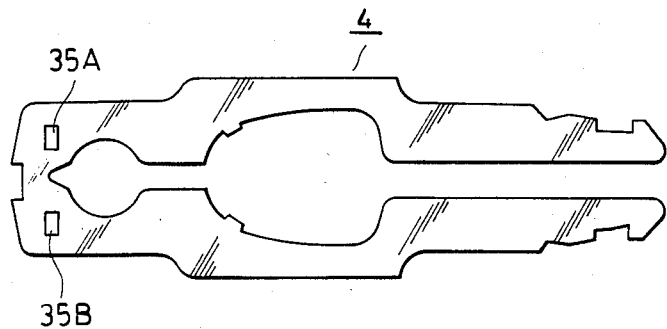
FIG. 6 is a plan view illustrating a plate spring.

The arm plate 2 and the plate spring 4 may be fixed by the following members instead of the pins 7 and 8 in order to further reduce the production cost. In FIG. 5, the arm plate 2 is formed at the tip thereof with a pair of tongues 33A and 33B and another tongue 34 all made by partly cutting the arm plate 5 itself and raising the cut portions vertically of the main surface thereof. On the other hand, the plate spring 4 is formed at the tip thereof with a pair of bores 35A and 35B for individually engaging the tongues 33A and 33B so that when the tongues 33A and 33B are inserted through the bores 35A and 35B and are bent onto the upper face of the plate spring, the arm plate 2 and the plate spring 4 are united together. This fixing method does not use caulking pins and thereby leads to a further cost reduction. The other tongue 34 engages the guide hole 12 of the changeover lever 11.

The embodiments of the invention in which an exclusive property or privilege is claimed are defined as follows:

1. A cross arm mechanism in a pushbutton tuner which comprises:
    an arm plate rotatably supporting a frequency setting plate;
    a plate spring mounted on said arm plate for locking said frequency setting plate from the circumference thereof; and
    first and second pins uniting said arm plate with said plate spring, said pins being different in height,
    wherein said pins are a pair of tongues made by partly cutting an end portion of said arm plate, said plate spring being formed at one end portion thereof with a pair of bores engaging said tongues.

2. A cross arm mechanism as set forth in claim 1 further including a guide pin fixed to said arm plate by caulking fixture and projecting downward from the lower face of the arm plate.

* * * * *